(12) United States Patent
Ikeda

(10) Patent No.: US 7,514,344 B2
(45) Date of Patent: Apr. 7, 2009

(54) LATERAL BIPOLAR TRANSISTOR

(75) Inventor: Tatsuhiko Ikeda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 115 days.

(21) Appl. No.: 11/682,126

(22) Filed: Mar. 5, 2007

(65) Prior Publication Data

US 2007/0205487 A1      Sep. 6, 2007

(30) Foreign Application Priority Data

Mar. 6, 2006    (JP)    ............... 2006-059950

(51) Int. Cl.
*H01L 21/425*     (2006.01)
(52) U.S. Cl. ............... 438/526; 438/575; 257/E51.004
(58) Field of Classification Search .............. 438/526, 438/565, 575
See application file for complete search history.

(56) References Cited

U.S. PATENT DOCUMENTS 3,754,170 A * 8/1973 Tsuda et al. ............... 257/659

6,982,473 B2 * 1/2006 Iwabuchi et al. ............ 257/565

FOREIGN PATENT DOCUMENTS

| JP | 63-5552    | 1/1988  |
|----|------------|---------|
| JP | 4-207038   | 7/1992  |
| JP | 6-151859   | 5/1994  |
| JP | 7-153774   | 6/1995  |
| JP | 2002-368002| 12/2002 |

* cited by examiner

*Primary Examiner*—Phat X Cao
*Assistant Examiner*—Nga Doan
(74) *Attorney, Agent, or Firm*—Oblon, Spivak, McClelland, Maier & Neustadt, P.C.

(57) ABSTRACT

A P+ base drawing diffusion region is formed on a substrate having an SOI structure. N+ emitter diffusion regions are formed on both sides of the P+ base drawing diffusion region through isolation insulating films interposed therebetween. A P type SOI layer, which serves as a base diffusion region, is formed so as to surround the N+ emitter diffusion regions, and conductive layers are formed thereon. Further, an N+ collector diffusion region is formed so as to surround the conductive layers.

7 Claims, 13 Drawing Sheets

LATERAL BIPOLAR TRANSISTOR

BACKGROUND OF THE INVENTION

1. Field of the Invention

The present invention relates to a lateral bipolar transistor, and particularly to a lateral bipolar transistor formed on a substrate having an SOI structure in which a silicon layer is provided on an embedded insulting film layer.

2. Background Art

As disclosed in, for example, Japanese Patent Application Laid-Open No. Hei 6(1994)-151859, there has heretofore been known a structure in which a transistor is formed on an SOI (Silicon On Insulator) substrate. The SOI substrate is provided with an embedded oxide film below a silicon layer that serves as a device forming area. According to such a structure, a parasitic capacitance of the substrate can be reduced. As a result, an integrated circuit can be speeded up.

Described more specifically, the above publication discloses a lateral bipolar transistor wherein an emitter diffusion region, a base diffusion region and a collector diffusion region are formed so as to reach the embedded oxide film. The SOI substrate has been used to improve the performance of a MOS transistor. In this case, such a bipolar transistor as described above might be formed on the SOI substrate along with the MOS transistor. When the MOS transistor is formed on the SOI substrate, a source-drain region is normally formed so as to reach the embedded oxide film for the purpose of reducing junction capacitance.

According to the construction of the lateral bipolar transistor, the emitter diffusion region and the collector diffusion region can be formed only by a process for forming the MOS transistor having the source-drain region that reaches the embedded oxide film. Therefore, according to the conventional structure, the integrated circuit having the MOS transistor and the bipolar transistor provided on the same SOI substrate can be prevented from increasing in cost.

Including the above-mentioned document, the applicant is aware of the following documents as a related art of the present invention.

[Patent document 1] Japanese Patent Application Laid-Open No. Hei 6(1994)-151859

[Patent document 2] Japanese Patent Application Laid-Open No. Hei 4(1992)-207038

[Patent document 3] Japanese Patent Application Laid-Open No. Sho 63(1988)-5552

[Patent document 4] Japanese Patent Application Laid-Open No. Hei 7(1995)-153774

[Patent document 5] Japanese Patent Application Laid-Open No. 2002-368002

Meanwhile, a general bipolar transistor has a base diffusion region shaped in a well shape, and an emitter diffusion region and a collector diffusion region formed in the well. According to such a structure, the emitter diffusion region and the collector diffusion region can respectively be brought into contact with the base diffusion region even at their bottom faces in addition to their side faces. Setting such a structure makes it possible to allow a sufficient collector current to circulate and ensure sufficient gain.

In the lateral bipolar transistor, however, the emitter diffusion region and the collector diffusion region can respectively contact the base diffusion region only at their side faces. It was therefore difficult to ensure a sufficient collector current according to the conventional lateral bipolar transistors. The lateral bipolar transistor was accompanied by the problem that when a base drawing diffusion region approached the emitter diffusion region, current flowing from the emitter to the base increased and emitter efficiency was hence degraded, thereby reducing gain.

SUMMARY OF THE INVENTION

The present invention has been made to solve the above problems. It is an object of the present invention to provide a lateral bipolar transistor which can be formed by use of a MOS process and is capable of ensuring a sufficient collector current and gain.

The above object is achieved by a lateral bipolar transistor formed over a substrate of an SOI structure having a silicon layer provided over an embedded insulating film layer. The lateral bipolar transistor includes emitter diffusion regions formed in the substrate; a base drawing diffusion region formed at a position away from each of the emitter diffusion regions; isolation insulating films that reach the embedded insulating film layer and are formed between the emitter diffusion regions and the base drawing diffusion region; a base diffusion region including, on both sides of the isolation insulating films, two end areas respectively brought into contact with the side faces of the isolation insulating films while ensuring electrical connections to the base drawing diffusion region, and central areas formed integrally with the two end areas so as to cover the peripheries of the emitter diffusion regions; and a collector diffusion region at least formed around the central areas of the base diffusion region.

The above object is also achieved by a lateral bipolar transistor formed over a substrate of an SOI structure having a silicon layer provided over an embedded insulating film layer. The lateral bipolar transistor includes an emitter diffusion region formed in the substrate; two base diffusion regions formed so as to interpose the emitter diffusion region therebetween; two collector diffusion regions formed so as to interpose the emitter diffusion region and the two base diffusion regions therebetween; at least two base drawing diffusion regions formed at positions away from the emitter diffusion region in a state of being respectively electrically connected to the two base diffusion regions; and an isolation insulating film formed so as to make contact with a whole region of a portion being in non-contact with the base diffusion regions, of the emitter diffusion region and reach the embedded insulating film layer.

Other objects and further features of the present invention will be apparent from the following detailed description when read in conjunction with the accompanying drawings.

BEST MODE FOR CARRYING OUT THE INVENTION

First Embodiment

Basic Structure of First Embodiment

Figure 1:
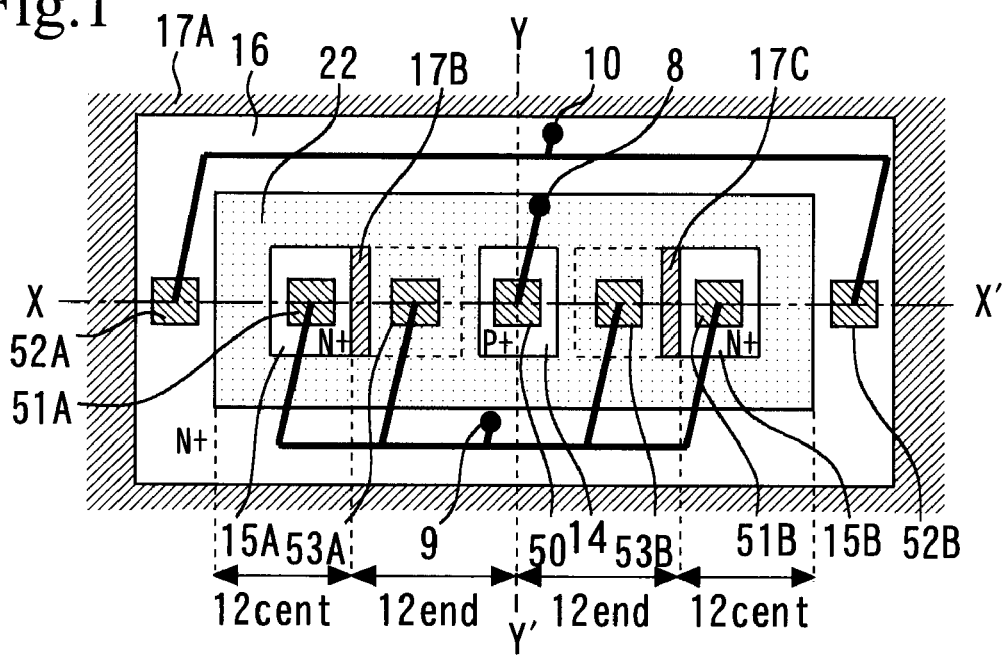
FIG. 1 is a plan view of a lateral bipolar transistor according to a first embodiment of the present invention.
Figure 2:
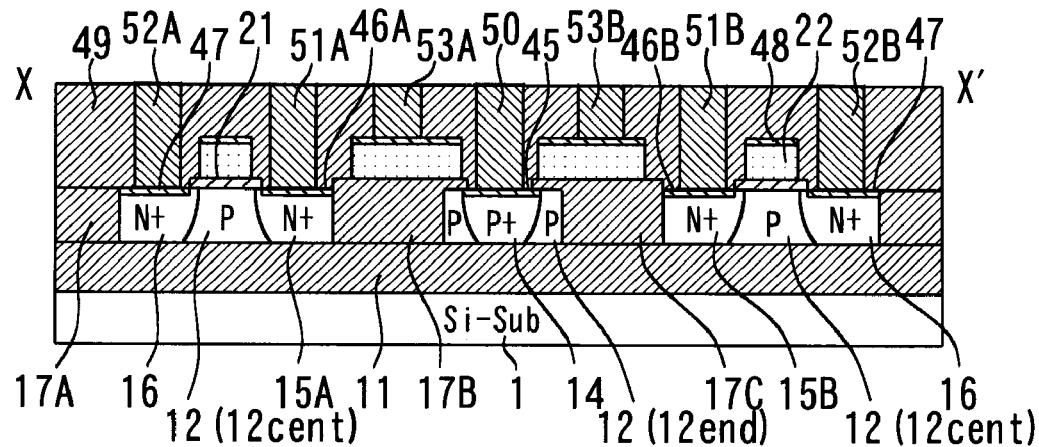
FIG. 2 is a sectional view obtained by cutting the lateral bipolar transistor of the first embodiment of the present invention along X-X' plane shown in FIG. 1.
Figure 3:
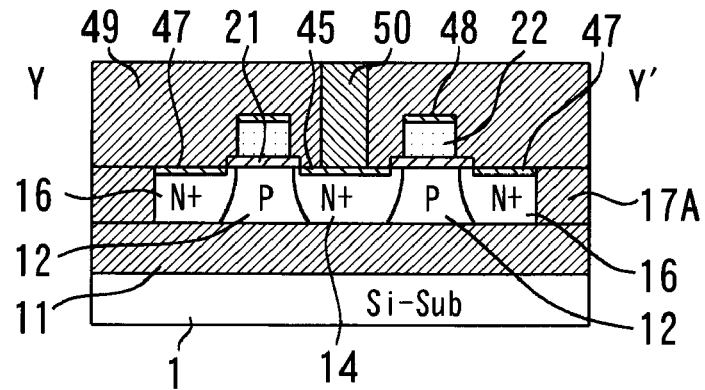
FIG. 3 is a sectional view obtained by cutting the lateral bipolar transistor of the first embodiment of the present invention along Y-Y' plane shown in FIG. 1.

A first embodiment of the present invention will be explained below. FIG. 1 is a plan view of a lateral bipolar transistor according to the present embodiment. FIG. 2 is a sectional view obtained by cutting the lateral bipolar transistor of the present embodiment along X-X' plane shown in FIG. 1. FIG. 3 is a sectional view obtained by cutting the lateral bipolar transistor of the present embodiment along Y-Y' plane shown in FIG. 1.

In FIGS. 1 through 3, reference numeral 1 indicates a P type silicon substrate. An embedded oxide film layer 11 is formed on the P type silicon substrate 1. As shown in the central portions of FIGS. 1 through 3, a high concentration P type base drawing diffusion region 14 (hereinafter called "P+ base drawing diffusion region 14") is formed on the embedded oxide film layer 11. The P+ base drawing diffusion region 14 is formed so as to take a rectangular (or square) shape as seen in the plane as shown in FIG. 1.

As shown in FIG. 2, isolation insulating films 17B and 17C are formed on both sides of the P+ base drawing diffusion region 14 with a P type SOI layer 12 interposed therebetween. In FIG. 1, areas for the isolation insulating films 17B and 17C are indicated by broken lines and hatching. As shown in FIG. 1, the isolation insulating films 17B and 17C are respectively formed so as to take a rectangular (or square) shape as seen in the plane.

As shown in FIG. 2, high concentration N type emitter diffusion regions 15A and 15B (hereinafter called "N+ emitter diffusion regions 15A and 15B") are formed further outside the isolation insulating films 17B and 17C. The N+ emitter diffusion regions 15A and 15B are both formed so as to take a rectangular (or square) shape as seen in the plane as shown in FIG. 1.

As shown in FIG. 2, a P type SOI layer 12 is formed on both sides of the N+ emitter diffusion regions 15A and 15B. The P type SOI layer 12 is an area that functions as a base diffusion region in the lateral bipolar transistor according to the present embodiment. The P type SOI layer 12 comprises a circular portion and branch portions. The circular portion is formed so as to surround the two N+ emitter areas 15A and 15B, the two isolation insulating films 17B and 17C located therebetween and the P+ base drawing diffusion region 14 located in the center of the transistor. The branch portions branch off out of the circular portion and are interposed between the P+ base drawing diffusion region 14 and the isolation insulating films 17B and 17C.

Hereinafter, portions of the P type SOI layer 12 that cover the side faces of the N+ emitter diffusion regions 15A and 15B are called "central areas 12cents". Other portions, i.e., portions for electrically bringing the central areas 12cents and the P+ base drawing diffusion region 14 into conduction on both sides of the isolation insulating films 17B and 17C are called "end areas 12ends".

The P type SOI layer 12 is covered with an insulating film 21 formed thereon. As shown in FIG. 2, the insulating film 21 is formed so as to be aligned with the isolation insulating films 17B and 17C in height. A conductive layer 22 composed of polysilicon is formed on each of the insulating film 21 and the isolation insulating films 17B and 17C. In FIG. 1, the conductive layer 22 is represented by an area shown in the form of a dotted surface.

As will be described later, the lateral bipolar transistor according to the present embodiment is manufactured by a MOS process. An N channel type MOS transistor is formed on the P type silicon substrate 1 together with the lateral bipolar transistor shown in FIGS. 1 through 3. The above mentioned insulating film 21 and the conductive layer 22 are formed, respectively, in manners similar to manners for forming a gate insulating film and a gate conductive layer provided in the MOS transistor.

As shown in FIGS. 2 and 3, a high concentration N type collector diffusion region 16 (hereinafter called "N+ collector diffusion region 16") is formed on the embedded oxide film layer 11 so as to cover the outer periphery of the P type SOI layer 12. The outer shape of the P type SOI layer 12 is approximately identical to that of the conductive layer 22. Therefore, when the lateral bipolar transistor according to the present embodiment is represented as seen in the plane, the N+ collector diffusion region 16 can be represented so as to surround the outer periphery of the conductive layer 22 as shown in FIG. 1.

As shown in FIGS. 1 through 3, an isolation oxide film 17A is formed outside the N+ collector diffusion region 16 so as to reach the embedded oxide film 11. In the present embodiment, one unit that functions as the single lateral bipolar transistor is formed inside the isolation oxide film 17A.

As shown in FIG. 2, a silicide layer 45 and a base contact 50 are formed on the P+ base drawing diffusion region 14. Silicide layers 46A and 46B and emitter contacts 51A and 51B are respectively formed on the N+ emitter diffusion regions 15A and 15B. A silicide layer 47, which covers the entire surface of the N+ collector diffusion region 16, is formed on the N+ collector diffusion region 16. Two collector contacts 52A and 52B are formed on the silicide layer 47 so as to be placed at both ends of the N+ collector diffusion region 16. Further, a silicide layer 48, which covers the entire surface of the conductive layer 22, is formed on the conductive layer 22. Conductive layer contacts 53A and 53B are formed on the silicide layer 48 at positions where they are placed directly above the isolation insulating films 17B and 17C.

As shown in FIG. 1 (silicide layers not shown), a base wiring 8 is connected to the base contact 50. A contact common wiring 10 is connected to the two collector contacts 52A and 52B. Further, an emitter common wiring 9 is connected to the two emitter contacts 51A and 51B and the two conductive layer contacts 53A and 53B.

Dimensions and Impurity Concentrations in the First Embodiment

The approximate dimensions of individual patterns of the lateral bipolar transistor according to the present embodiment and their impurity concentrations are as follows:

Impurity concentration of support substrate 1:
  $10^{15} \sim 10^{16}$ cm$^{-3}$
Thickness of embedded oxide film 11:
  0.02~0.2 μm
Thickness of SOI layer:
  0.05~0.3 cm
Impurity concentration of P type SOI layer 12:
  $10^{15} \sim 10^{18}$ cm$^{-3}$
Thickness of insulating film 21:
  several~several tens of nm
Thickness of conductive layer 22:
  0.5~0.3 μm
Impurity concentration of P+ base drawing diffusion layer:
  $10^{19 \sim 1022}$ cm$^{-3}$
Impurity concentrations of N+ emitter diffusion regions 15A and 15B and N+ collector diffusion region 16:
  $10^{19} \sim 10^{22}$ cm$^{-3}$

Manufacturing Method According to First Embodiment

A method of manufacturing the lateral bipolar transistor according to the present embodiment will next be explained with reference to FIGS. 4 through 8. As mentioned above, the lateral bipolar transistor according to the present embodiment is formed on a P type silicon substrate 1 together with an N channel type MOS transistor. FIGS. 4 through 8 show a process for manufacturing the lateral bipolar transistor of the present embodiment by use of a MOS process.

Figure 4:
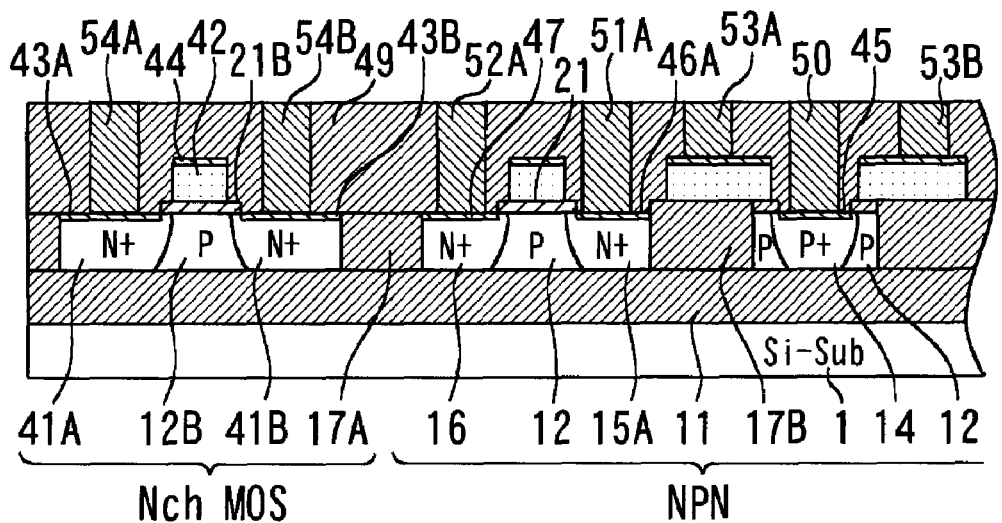
FIGS. 4 through 8 are diagrams for describing a fabricating method of the lateral bipolar transistor of the first embodiment of the present invention.

Described more specifically, FIG. 4 shows the N channel type MOS transistor in the left side area (hereinafter called "Nch MOS area") and illustrates a part of the lateral bipolar transistor of the present embodiment in the right side area (hereinafter called "NPN area"). FIGS. 5 through 8 respectively show the Nch MOS area and the NPN area in a manner similar to FIG. 4.

That is, source•drain regions 41A and 41B and a P type SOI layer 12B interposed therebetween are formed in the Nch MOS area in FIG. 4. Silicide layers 43A and 43B as well as source•drain contacts 54A and 54B are respectively formed on the source•drain regions 41A and 41B. A gate insulating film 21B and a gate conductive layer 42 are formed on the P type SOI layer 12B. The gate conductive layer 42 is covered with silicide 44. Since the configuration of the NPN area is similar to the configuration described with reference to FIGS. 1 through 3, its explanation is omitted here.

Figure 5:
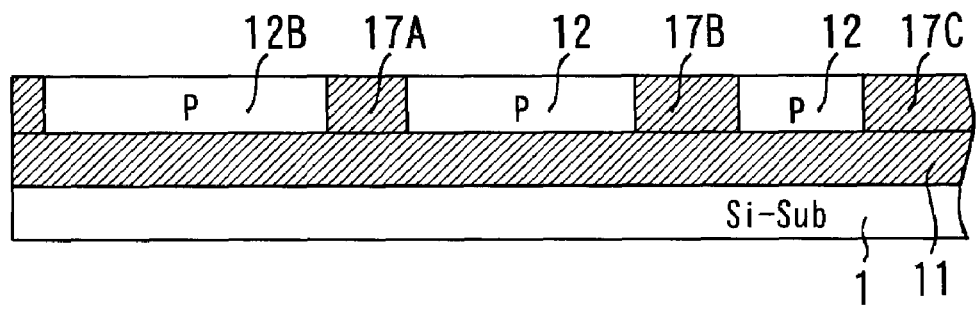

Upon manufacturing the construction shown in FIG. 4, an embedded oxide film 11 and an SOI layer are first stacked on the P type silicon substrate 1 as shown in FIG. 5. Next, isolation insulating films 17A, 17B and 17C as well as P type SOI layers 12 and 12B are formed over the P type silicon substrate 1. The isolation insulating films 17A, 17B and 17C are formed by a method such as trench isolation. The P type SOI layers 12 and 12B may be formed by doping the SOI layer with a P type impurity before the formation of the isolation insulating films 17A, 17B and 17C or by doping the SOI layer with the P type impurity after the formation of the isolation insulating films 17A, 17B and 17C.

Figure 6:
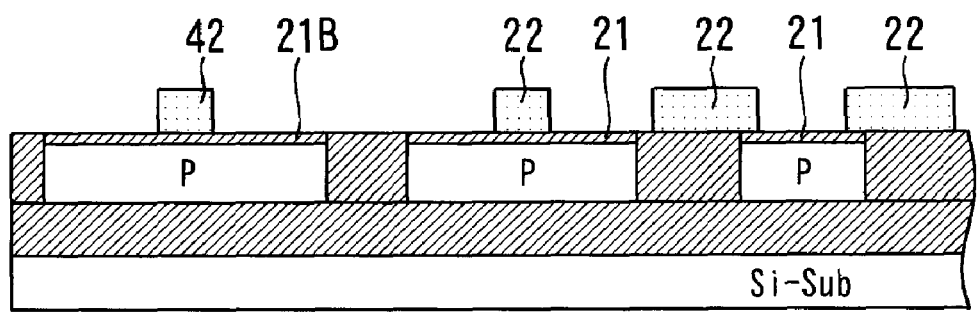

Next, as shown in FIG. 6, an insulating film 21 for a bipolar transistor and a gate insulating film 21B for a MOS transistor are respectively formed on the P type SOI layers 12 and 12B. Further, conductive layers 22 for the bipolar transistor and a gate conductive layer 42 for the MOS transistor are formed thereon. Desired impurity is doped into each conductive layer 22 and the gate conductive layer 42 before patterning.

Figure 7:
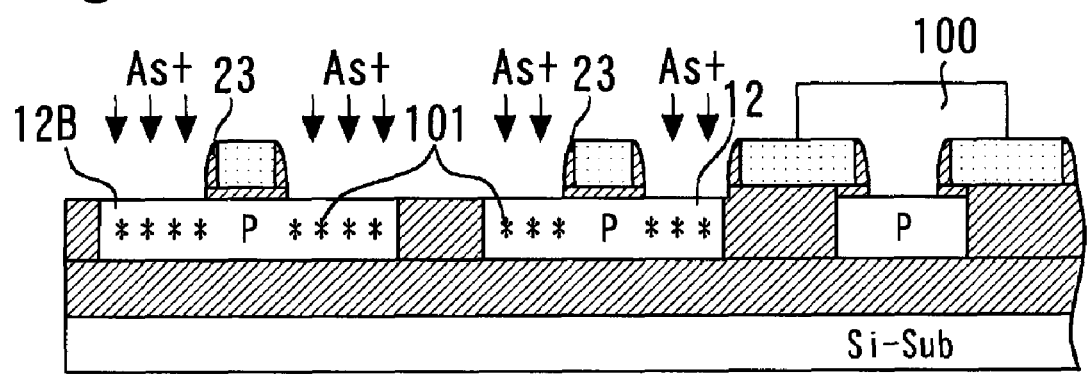

Next, as shown in FIG. 7, a structure (not shown) of an LDD (Lightly Doped Drain) and sidewalls 23 composed of an insulating film are formed by a standard MOS process. Then, an N type impurity 101 such as arsenic is implanted into the P type SOI layers 12 and 12B by the process of forming the source/drain of the N channel type MOS transistor with a photo-resist 100 as a mask. Described more specifically, the N type impurity 101 is implanted into an area to form the N+ emitter diffusion regions 15A and 15B, N+ collector diffusion region 16 and source-drain regions 41A and 41B.

Figure 8:
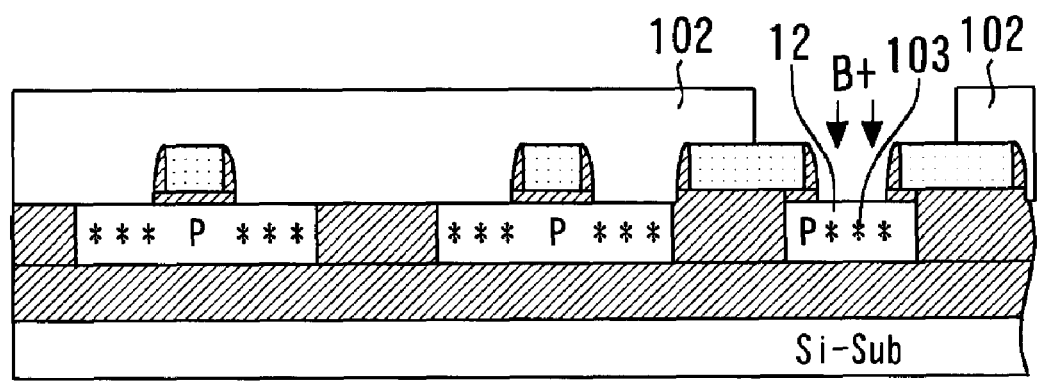

After removal of the photo-resist 100, a P type impurity 103 such as boron is implanted into the P type SOI layer 12 as shown in FIG. 8 using the process of forming the source/drain of a P channel type MOS transistor (not shown) with a photo-resist 102 as a mask. More specifically, the P type impurity 103 is implanted into an area to form a P+ base drawing diffusion region 14.

The impurities implanted by the above processes are activated by heat treatment so that the N+ emitter diffusion regions 15A and 15B, N+ collector diffusion region 16, source-drain regions 41A and 41B and P+base drawing diffusion region 14 are formed. Next, silicide layers 43A, 43B, 44, 45, 46A, 46, 47, and 48 are selectively formed on silicon and poly-silicon.

An insulating film 49 is formed so as to cover the surface of the P type silicon substrate 1. Contact holes are formed in the insulating film 49, and a metal such as tungsten is embedded therein. As a result, various contacts 50, 51A, 51B, 52A, 52B, 53A, 53B, 54A and 54B are formed. Thereafter, various wirings 8 through 10 are processed so that the lateral bipolar transistor according to the present embodiment is formed on the P type silicon substrate 1 along with the N channel type MOS transistor.

Features of First Embodiment (Utilization of MOS Process)

As described above, the lateral bipolar transistor according to the present embodiment can be manufactured together with the MOS transistor using a general MOS process. Therefore, according to the structure of the present embodiment, devices that need to provide the MOS transistor and the lateral bipolar transistor on the same substrate can be manufactured at low cost.

(Ensuring of Sufficient Gain)

The lateral bipolar transistor according to the present embodiment has such a structure that as shown in FIGS. 1 through 3, each of the N+ emitter diffusion regions 15A and 15B is brought into contact with its corresponding central area 12cent of the P type SOI layer 12 (base diffusion region) at three sides. And the P type SOI layer 12 is in contact with the N+ collector region 16 at its entire periphery.

A general lateral bipolar transistor has such a construction that a base diffusion region is interposed between an emitter diffusion region and a collector diffusion region. According to the construction of the present embodiment, the areas at which the N+ emitter diffusion regions 15A and 15B are opposite to the N+ collector diffusion region 16 with the P type SOI layer 12 (base diffusion region) being interposed therebetween, can be ensured sufficiently on a large scale as compared with such a general construction.

Meanwhile, the areas at which the N+ emitter diffusion regions 15A and 15B and the N+ collector diffusion region 16 are opposite to one another through the P type SOI layer 12, can sufficiently be ensured even by a structure like a comparative example to be described below as well as the structure of the present embodiment.

Figure 9:
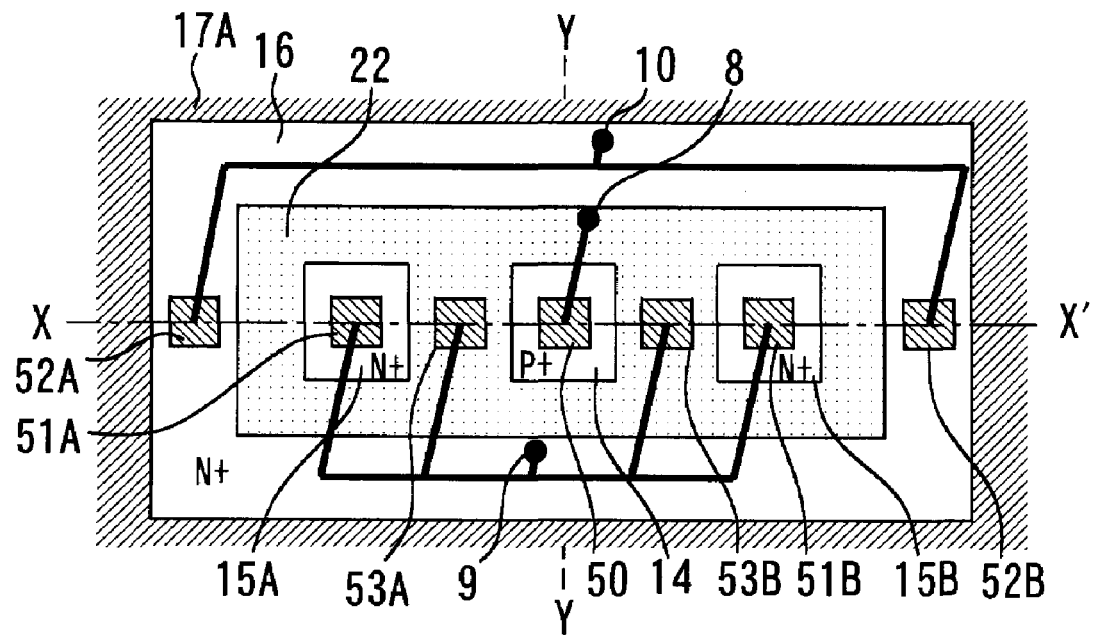
FIG. 9 is a plan view of a lateral bipolar transistor showing a comparative example.
Figure 10:
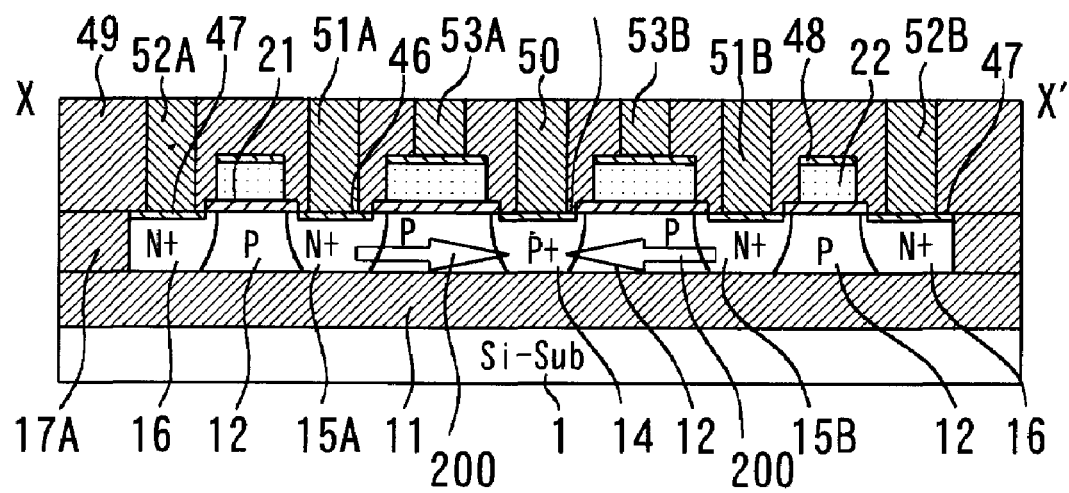
FIG. 10 is a sectional view obtained by cutting the lateral bipolar transistor of the comparative example along X-X' plane shown in FIG. 9.

FIG. 9 is a plan view of a lateral bipolar transistor showing the comparative example. FIG. 10 is a sectional view obtained by cutting the lateral bipolar transistor of the comparative example along X-X' plane shown in FIG. 9. In FIGS. 9 and 10, constituent elements identical to the constituent elements shown in FIGS. 1 through 3 are respectively given common reference numerals.

The lateral bipolar transistor according to the comparative example has a structure similar to the lateral bipolar transistor according to the present embodiment except that no isolation insulating films 17B and 17C are provided between a P+ base drawing diffusion region 14 and N+ emitter diffusion regions 15A and 15B disposed on both sides thereof.

In the structure of the comparative example, however, such a region that an emitter current passes through a P type SOI layer 12 and flows directly into the P+ base drawing diffusion region 14 exists between each of the N+ emitter diffusion regions 15A and 15B and the P+ base drawing diffusion region 14 as indicated by arrow 200 in FIG. 10. In this case, the amount of the current that passes through the true base (P type SOI layer 12) and flows into an N+ collector diffusion region 16 is inevitably reduced by the current flowing directly into the P+base drawing diffusion region 14. When the amount of the emitter current flowing into the N+ collector diffusion region 16 is reduced, the injection efficiency of the emitter is lowered and the gain of the transistor is hence reduced.

On the other hand, in the structure of the present embodiment, the isolation insulating films 17B and 17C are respectively provided between the N+ emitter diffusion regions 15A and 15B and the P+ base drawing diffusion region 14. According to such a structure, the flow of the current from the N+ emitter diffusion regions 15A and 15B to the P+ base drawing diffusion region 14 can substantially be blocked and hence the loss of the injection efficiency of the emitter can be suppressed to the minimum. Therefore, according to the lateral bipolar transistor of the present embodiment, it can obtain excellent gain as compared with the comparative example.

(Securing of Current Capacity)

In the first embodiment as described above, the single lateral bipolar transistor is provided with the two N+ emitter diffusion regions 15A and 15B, and the P type SOI layer 12 and the N+collector diffusion region 16 are circularly formed so as to surround the two N+ emitter diffusion regions 15A and 15B. Further, in the first embodiment, the common wiring 9 is provided for the two emitter contacts 51A and 51B, and the common wiring 10 is provided for the two collector contacts 52A and 52B under such a construction.

According to such a structure, a double current capacity can be applied to the lateral bipolar transistor as compared with the case in which only one N+ emitter diffusion region is provided. Therefore, according to the structure of the present embodiment, a lateral bipolar transistor large in current capacitor can be realized.

(Prevention of Channel Occurrence in P Type SOI Layers)

Most commonly, the lateral bipolar transistor according to the present embodiment is used in a state in which the emitter potential is held at the lowest potential. According to the construction of the present embodiment, the P type SOI layer 12, which functions as a base diffusion region, is covered by the conductive layer 22 through the insulating film 21 interposed therebetween. And the conductive layer 22 is connected to the emitter common wiring 9 in a manner similar to the N+ emitter diffusion regions 15A and 15B.

According to such a construction, the potential of the conductive layer 22 can be fixed to the emitter potential which is the minimum potential. Since the threshold voltage of MOS is normally set to plus, no N type channel is formed in the P type SOI layer 12 if the conductive layer 22 is fixed to the lowest potential. If the occurrence of the channel in the P type SOI layer 12 can be blocked, it is then possible to prevent a reduction in the emitter injection efficiency due to circulation of carriers in the channel. Even in this point, the lateral bipolar transistor of the present embodiment has a characteristic excellent in securing high gain.

(Resistance Characteristic at Contact Production)

In the present embodiment as described above, the occurrence of the channel in the P type SOI layer 12 is prevented by fixing the conductive layer 22 to the emitter potential. In order to realize such a function, the conductive layer contacts 53A and 53B are provided on the conductive layer 22.

In the present embodiment in particular, the conductive layer contacts 53A and 53B are formed on the conductive layer 22 at the areas directly above the isolation insulating films 17B and 17C (see FIG. 2). Each of the conductive layer contacts 53A and 53B may also be formed in the area placed directly above the P type SOI layer 12 without being limited to the areas. When, however, such a construction is taken, there may be cases in which damage occurs in the insulting film 21 with the formation of the contacts and a leak is developed between the conductive layer 22 and the P type SOI layer 12.

Since the isolation insulating films 17B and 17C are of thick insulating layers that reach the embedded oxide film layer, it is possible to virtually prevent the occurrence of the damage with the formation of the contacts if the contacts are formed directly above the isolation insulating films 17B and 17C. In this point of view, the lateral bipolar transistor of the present embodiment has even the advantage that the management of its quality is easy.

Modification of First Embodiment

As described above, the lateral bipolar transistor of the present embodiment is configured so as to have the two N+ emitter diffusion regions 15A and 15B with respect to one P+ base drawing diffusion region 14. However, the present invention is not limited to such a construction. That is, only one N+ emitter diffusion region may be provided with respect to one P+ base drawing diffusion region 14.

Figure 11:
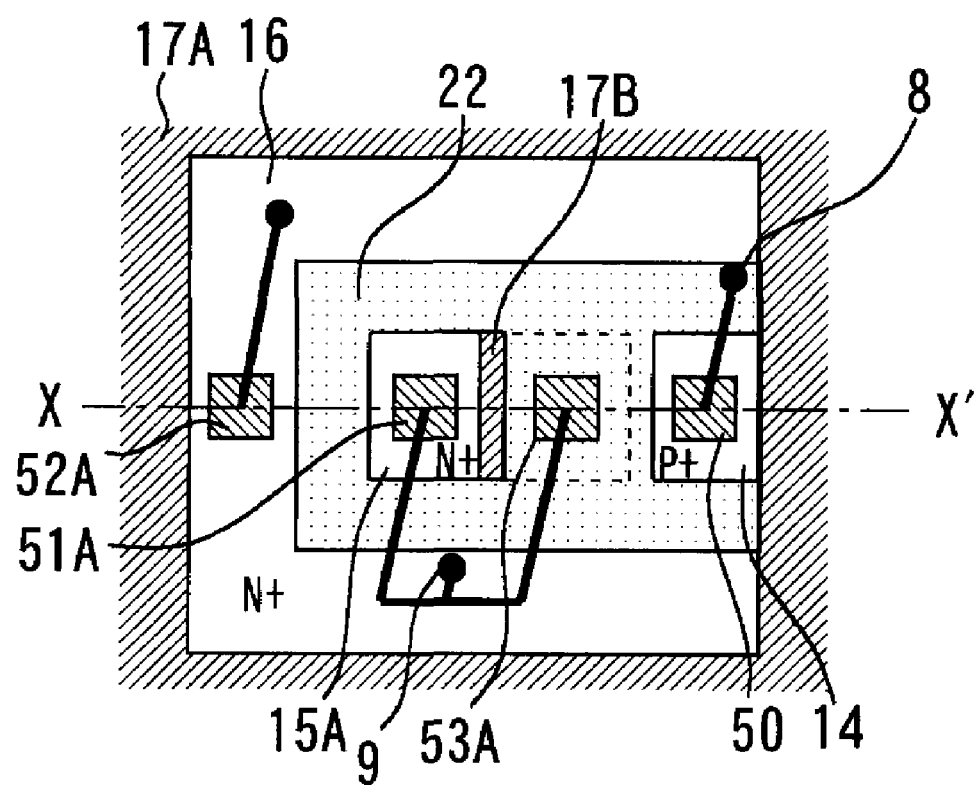
FIG. 11 is a plan view of a lateral bipolar transistor which is a modification of the first embodiment of the present invention.

FIG. 11 is a plan view of a lateral bipolar transistor wherein only one N+ emitter diffusion region is provided with respect to a P+ base drawing diffusion region 14. In FIG. 11, constituent elements identical to those shown in FIG. 1 are respectively given common reference numerals. The modification shown in FIG. 11 has such a construction as to be obtained by approximately dividing the lateral bipolar transistor of the first embodiment into two.

According to such a construction, although the current capacity is reduced as compared with the first embodiment, other effects, that is, effects such as securing of high gain, prevention of the channel occurrence in the P type SOI layer 12, prevention of damage with the formation of each contact, etc. can be obtained in a manner similar to the first embodiment.

Incidentally, although the NPN type bipolar transistor and the N channel type MOS transistor are formed on the same substrate in the first embodiment, the application of the present invention is not limited to this case. That is, PNP type bipolar transistors and P channel type MOS transistors may be formed on the same substrate in addition to above.

Although the P+ base drawing diffusion region 14, N+ emitter diffusion regions 15A and 15B, N+ collector diffusion region 16 and the like are made rectangular or square shaped in the first embodiment, their shapes are not limited to the same. That is, their shapes may be circular or elliptical.

Second Embodiment

Figure 12:
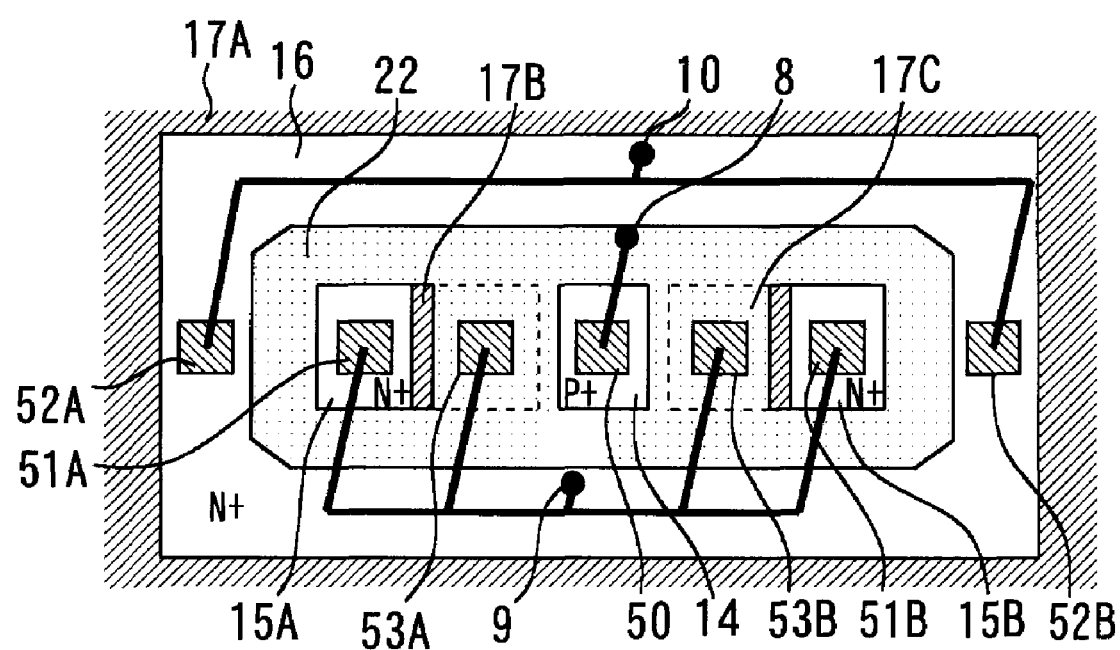
FIG. 12 is a plan view of a lateral bipolar transistor showing a second embodiment of the present invention.

A second embodiment of the present invention will next be explained with reference to FIG. 12. FIG. 12 is a plan view of a lateral bipolar transistor showing the second embodiment of the present invention. The construction shown in FIG. 12 is similar to the construction shown in FIG. 1 except that the corners are cut at the four corners of a conductive layer 22.

In the lateral bipolar transistor according to the present embodiment, an insulating film 21 and a P type SOI layer 12 (both not shown in FIG. 12) located below the conductive layer 22 are both shaped in corner-cut forms at the four corners in a manner similar to the conductive layer 22. The lateral bipolar transistor according to the present embodiment is similar to the transistor of the first embodiment except that these elements are brought into the corner-cut shapes.

A bipolar transistor is often used with a reverse bias being applied between its collector and base. When the reverse bias is applied to the lateral bipolar transistor of the first embodiment, electric field is apt to concentrate on the four corners, i.e., corner portions of the conductive layer 22. When the concentration of such electric field occurs, withstand voltage of the transistor is apt to reduce. On the other hand, when the corners of the conductive layer 22 are cut, it is possible to relax the concentration of electric field. Therefore, according to the construction of the present embodiment, the lateral bipolar transistor high in withstand voltage can be realized.

The construction of the first embodiment described above causes the circumstances that the distance between each of the N+ emitter diffusion regions 15A and 15B and the N+ collector layer 16 becomes long in the areas corresponding to the corners of the conductive layer 22 as compared with other areas. The emitter current is easy to circulate as the distance between the emitter and collector becomes shorter. When the corners of the conductive layer 22 are cut, the distance between the emitter and collector at the four corners of the conductive layer 22 can be shortened. Therefore, according to the construction of the present embodiment, the circulation of the emitter current can be facilitated and the efficiency of the bipolar transistor can further be improved, as compared with the first embodiment.

Third Embodiment

Figure 13:
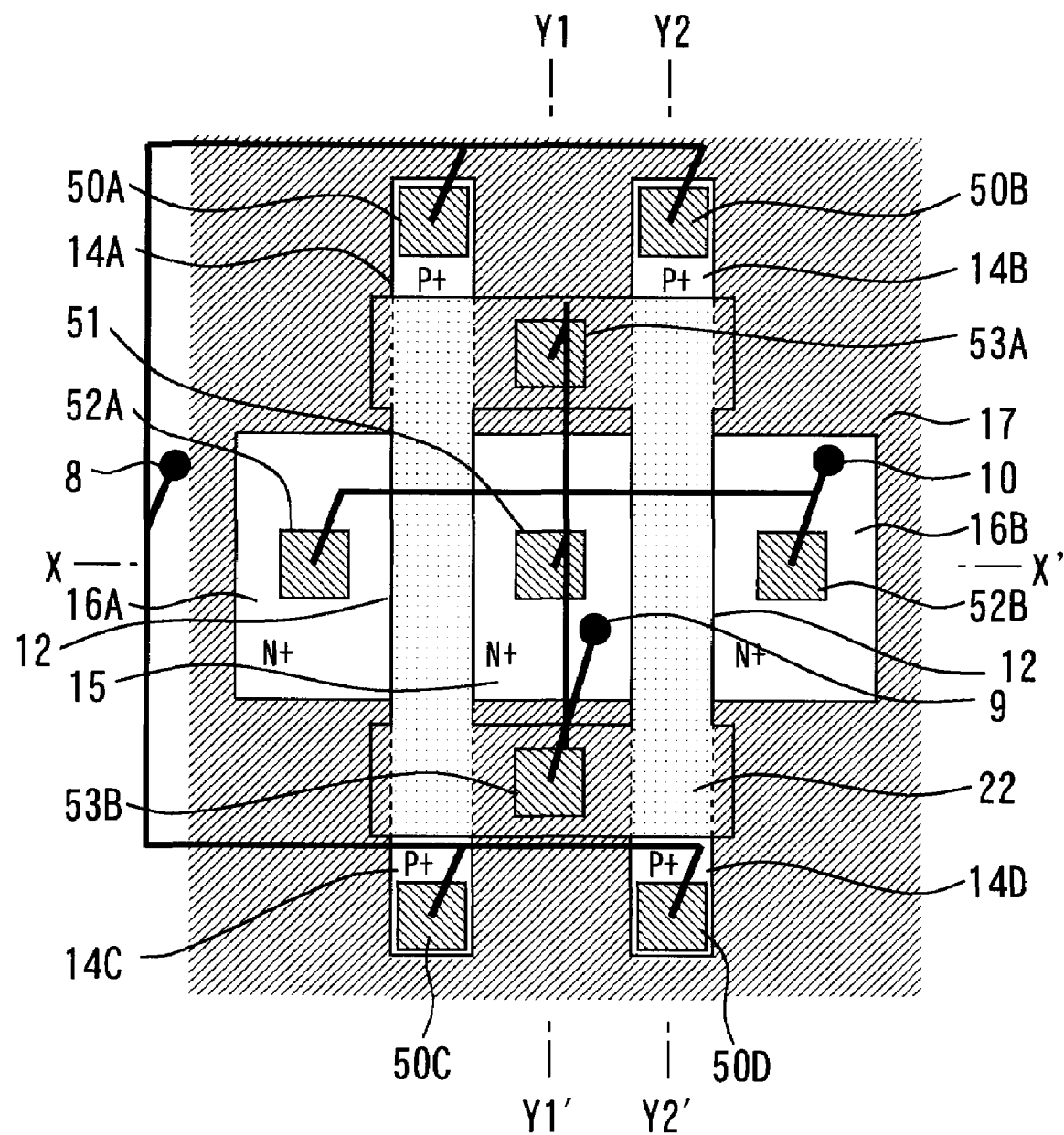
FIG. 13 is a plan view of a lateral bipolar transistor according to a third embodiment of the present invention.
Figure 14:
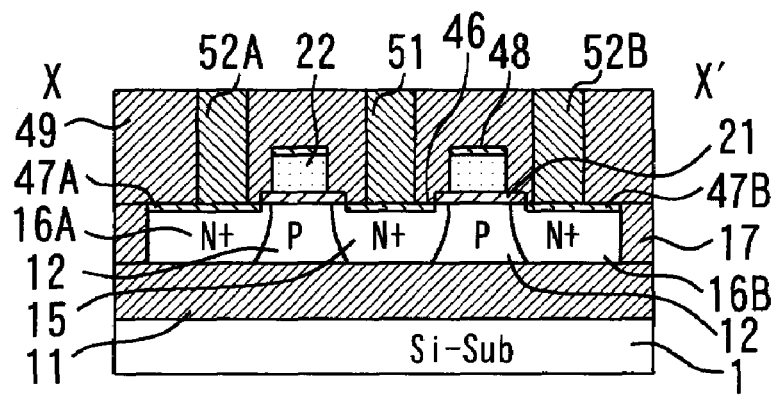
FIG. 14 is a sectional view obtained by cutting the lateral bipolar transistor according to the third embodiment of the present invention along X-X' plane shown in FIG. 13.
Figure 15:
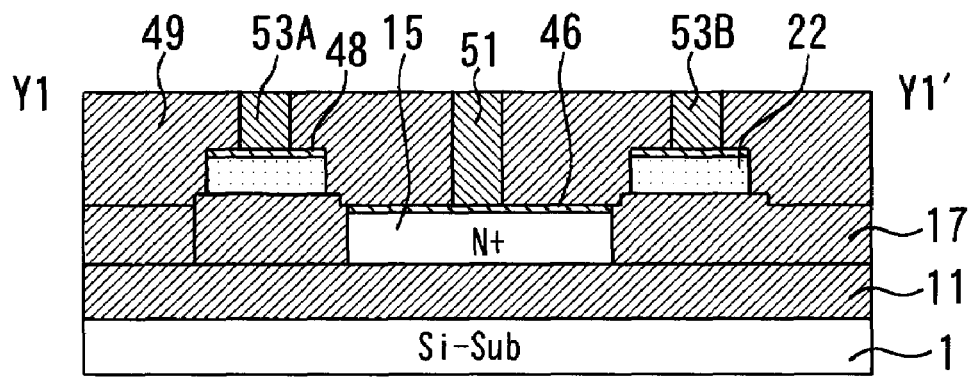
FIG. 15 is a sectional view obtained by cutting the lateral bipolar transistor according to the third embodiment of the present invention along Y1-Y1' plane shown in FIG. 13.
Figure 16:
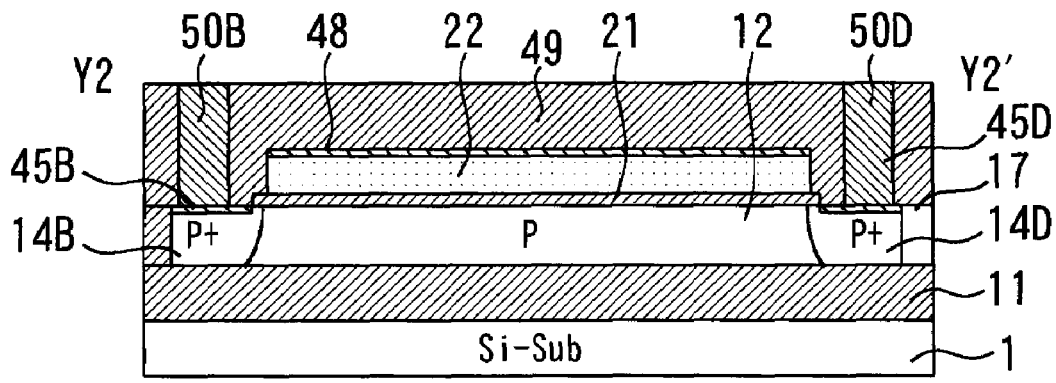
FIG. 16 is a sectional views obtained by cutting the lateral bipolar transistor according to the third embodiment of the present invention along Y2-Y2' plane shown in FIG. 13.

A third embodiment of the present invention will next be explained with reference to FIGS. 13 through 16. FIG. 13 is a plan view of a lateral bipolar transistor according to the present embodiment. FIG. 14 is a sectional view obtained by cutting the lateral bipolar transistor according to the present embodiment along X-X' plane shown in FIG. 13. FIGS. 15 and 16 are respectively sectional views obtained by cutting the lateral bipolar transistor according to the present embodiment along Y1-Y1' plane and Y2-Y2' plane shown in FIG. 13.

In FIGS. 13 through 16, corresponding portions to the constituent elements employed in the first or second embodiment are respectively given common reference numerals. In a manner similar to the first embodiment, the illustration of a silicide layer is omitted in FIG. 13 showing the plan view of the lateral bipolar transistor.

As descried in the first embodiment, the suppression of an emitter current from an emitter diffusion region to a base drawing diffusion region is effective in improving gain of a lateral bipolar transistor. Additionally, greatly securing an area at which the emitter diffusion region and its corresponding collector diffusion region are opposite to each other with a base diffusion region interposed therebetween is effective in sufficiently ensuring a collector current.

The structure of the present embodiment shown in FIGS. 13 through 16 is one example of a structure that satisfies those requirements and is different from the structure of the first embodiment. That is, the lateral bipolar transistor according to the present embodiment has a single N+ emitter diffusion region 15 at its central portion.

P type SOI layers 12 (areas each shown in the form of a dotted surface in FIG. 13) are respectively formed on both sides of the emitter diffusion region 15. P+ base drawing diffusion regions 14A and 14C are respectively formed at positions where they are brought into contact with both ends of the P type SOI layer 12 provided on the left side in FIG. 13. P+ base drawing diffusion regions 14B and 14D are respectively formed at positions where they are brought into contact with both ends of the P type SOI layer 12 provided on the right side in FIG. 13.

An N+ collector diffusion region 16A is formed on the left side of the P type SOI layer 12 placed on the left side in FIG. 13. An N+ collector diffusion region 16B is formed on the right side of the P type SOI layer 12 placed on the right side in FIG. 13. The peripheries of the N+ emitter diffusion region 15, P type SOI layer 12, P+ base drawing diffusion regions 14A, 14B, 14C and 14D and N+ collector diffusion regions 16A and 16B are surrounded by an isolation insulating film 17.

That is, according to the structure of the present embodiment, the four P+ base drawing diffusion regions 14A, 14B, 14C and 14D are formed so as to be away from the N+ emitter diffusion region 15 in a state in which they are electrically connected to the two P type SOI layers 12. The two sides being in non-contact with the P type SOI layers 12, of the N+ emitter diffusion region 15 are in contact with the isolation insulating film 17 in its entire region. The isolation insulating film 17 is formed so as to reach an embedded oxide film 11. Therefore, the isolation insulating film 17 electrically cuts off between N+ emitter diffusion region 15 and the P+ base drawing diffusion regions 14A, 14B, 14C and 14D.

As shown in FIG. 14, an insulating film 21 is formed on the P type SOI layers 12. A conductive layer 22 is formed on the insulating film 21. The surface of the conductive layer 22 is covered with a silicide layer 48 at its entire surface.

As shown in FIG. 15, the conductive layer 22 and the silicide layer 48 are formed even on the isolation insulating film 17 on both sides of the N+ emitter diffusion region 15. That is, as shown in FIG. 13, the conductive layer 22 and the silicide layer 48 are formed in the form of a ring-shaped pattern including two longitudinal sides respectively extending between the P+ base drawing diffusion regions 14A and 14C and between the P+ base drawing diffusion regions 14B and 14C.

As shown in FIG. 14, a silicide layer 46 and an emitter contact 51 are formed on the N+ emitter diffusion region 15. Silicide layers 47A and 47B and collector contacts 52A and 52B are respectively formed on the N+ collector diffusion regions 16A and 16B.

As shown in FIG. 15, conductive layer contacts 53A and 53B are formed on the silicide layer 48 placed on the conductive layer 22. More specifically, the conductive layer contacts 53A and 53B are formed in their corresponding areas located directly above the isolation insulating film 17 without being formed in areas placed directly above the P type SOI layers 12.

As shown in FIG. 16, silicide layers 45B and 45D and base contacts 50B and 50D are respectively formed on the P+base drawing diffusion regions 14B and 14D. Similarly, silicide layers 45A and 45C and base contacts 50A and 50C are respectively formed on the P+ base drawing diffusion regions 14A and 14C on the sides opposite to the P+ base drawing diffusion regions 14B and 14D.

As shown in FIG. 13 (silicide layers not shown), a common base wiring 8 is connected to the base contacts 50A, SOB, 50C and 50D. A contact common wiring 10 is connected to the two collector contacts 52A and 52B. Further, an emitter common wiring 9 is connected to the emitter contact 51 and the two conductive layer contacts 53A and 53B.

Features of Third Embodiment (Utilization of MOS Process)

In a manner similar to the first embodiment, the lateral bipolar transistor according to the present embodiment can be manufactured together with the MOS transistor using a general MOS process. Therefore, according to the structure of the present embodiment, devices that need to provide the MOS transistor and the lateral bipolar transistor on the same substrate can be manufactured at low cost.

(Securing of Sufficient Gain)

In the lateral bipolar transistor of the present embodiment as described above, the N+ emitter diffusion region 15 and the P+ base drawing diffusion regions 14A, 14B, 14C and 14D are electrically cut off by the isolation insulating film 17. According to such a structure, it is possible to prevent the emitter current from circulating between the N+ emitter diffusion region 15 and the P+ base drawing diffusion regions 14A, 14B, 14C and 14D in a manner similar to the first embodiment. The loss of injection efficiency of the emitter can hence be suppressed to the minimum. Due to the above reasons, according to the lateral bipolar transistor of the present embodiment, it can obtain excellent gain in a manner similar to the first embodiment.

(Securing of Current Capacity)

According to the construction of the third embodiment, the common wiring 10 is provided with respect to the two collector contacts 52A and 52B. The common wiring 8 is provided with respect to the four P+ base drawing diffusion regions 50A, 50B, 50C and 50D, i.e., the two P type SOI layers 12 (base diffusion regions). According to such a structure, current capacity equal to twice that of the above-described general bipolar transistor can be obtained. Therefore, according to the structure of the present embodiment, a lateral bipolar transistor large in current capacity can be materialized.

(Prevention of Channel Occurrence in P Type SOI Layers)

Even in the structure of the present embodiment, the conductive layer 22 is formed on each of the P type SOI layers 12 each functioning as the base diffusion region through the insulating film 12 interposed therebetween in a manner similar to the first embodiment. The conductive layer 22 is connected to the emitter common wiring 9 in a manner similar to the N+ emitter diffusion region 15. According to such a construction, it is possible to effectively prevent the occurrence of channels in the P type SOI layers 12 in a manner similar to the first embodiment.

(Resistance Characteristic at Contact Production)

According to the structure of the present embodiment as described above, the conductive layer contacts 53A and 53B are formed on the isolation insulating film 17. Therefore, the occurrence of damage in the insulating film with the formation of the conductive layer contacts 53A and 53B can virtually be prevented perfectly even by the structure of the present embodiment in a manner similar to the first embodiment.

(Reduction Effect of Device Area)

According to the structure of the present embodiment, the area of the N+ collector diffusion region can greatly be reduced as compared with the first embodiment although the number of the P+ base drawing diffusion regions increases. In addition to above, the present structure can inevitably prevent the production of the corner portions of the conductive layer 22 where the electric field concentration is apt to arise. Therefore, according to the structure of the present embodiment, electric current similar to that of the first embodiment can be obtained in a small device area.

Fourth Embodiment

Figure 17:
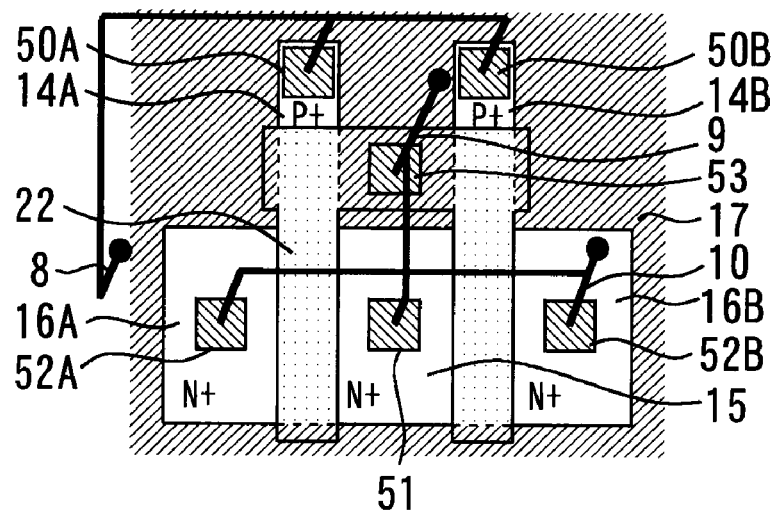
FIG. 17 is a diagram for describing the construction of a lateral bipolar transistor according to the fourth embodiment of the present invention

A fourth embodiment of the present invention will next be described with reference to FIG. 17. FIG. 17 is a diagram for describing the construction of a lateral bipolar transistor according to the fourth embodiment of the present invention. In FIG. 17, portions equivalent to the constituent elements employed in any of the first through third embodiments are respectively given common reference numerals. The lateral bipolar transistor shown in FIG. 17 has the construction similar to the transistor of the third embodiment except that its emitter length is shortened and P +base drawing diffusion regions 14A and 14B are disposed only on one sides of P type SOI layers 12.

In a case where the amount of electric current required for the lateral bipolar transistor is small, short emitter length can be employed. When the emitter length is reduced at the construction of the third embodiment, the distances from the P+ base drawing diffusion regions 14A and 14B to operating portions of the transistor, that is, portions where the N+ emitter diffusion region 15 and the N+ collector diffusion regions 16A and 16B are opposed with the P type SOI layers 12 interposed therebetween, respectively, are shortened and hence the resistance therebetween is reduced.

If the resistance is sufficiently low, it is then possible to satisfy electrical characteristics required for the transistor even though the P+ base drawing diffusion regions 14A and 14B are placed only on one sides of the P type SOI layers 12 as in the case of the fourth embodiment. According to such a construction, the device area of the transistor can further be reduced as compared with the third embodiment. Therefore, according to the construction of the fourth embodiment, a lateral bipolar transistor further reduced in size as compared with the third embodiment can be realized.

Fifth Embodiment

Figure 18:
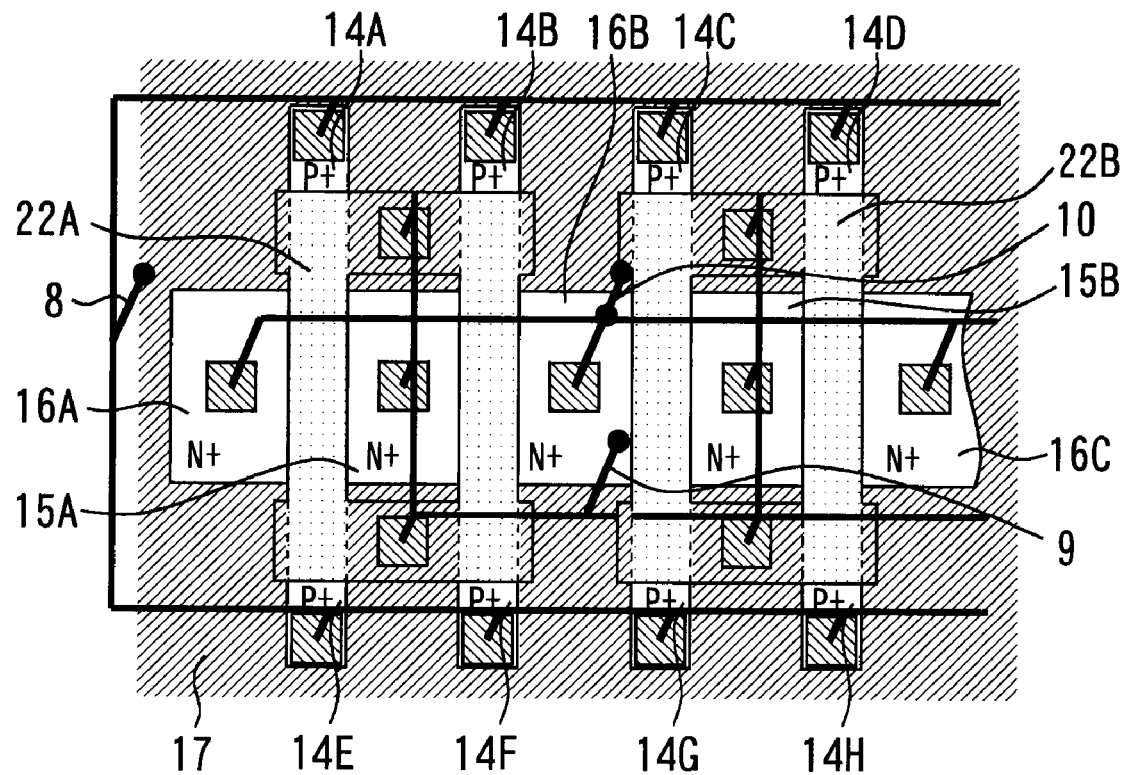
FIG. 18 is a diagram for describing the construction of a lateral bipolar transistor according to a fifth embodiment of the present invention.

A fifth embodiment of the present invention will next be described with reference to FIG. 18. FIG. 18 is a diagram for describing the construction of a lateral bipolar transistor according to the fifth embodiment of the present invention. In FIG. 18, portions equivalent to the constituent elements employed in any of the first through fourth embodiments are respectively given common reference numerals.

The lateral bipolar transistor shown in FIG. 18 comprises n N+ emitter diffusion regions 15A, 15B, . . . , and (n+1) N+ collector diffusion regions 16A, 16B, 16C, . . . . The N+ emitter diffusion regions 15A, 15B, . . . , and the N+ collector diffusion regions 16A, 16B, 16C, . . . are provided in such a manner that P type SOI layers 12 are interposed between their boundary portions and alternately aligned with one another. Conceptually, such a construction can be obtained by arranging the lateral bipolar transistor (see FIG. 13) of the third embodiment in parallel in plural form in such a manner that the N+ collector diffusion region 16B overlaps with the N+ collector diffusion region 16A.

According to the construction (see FIG. 13) of the third embodiment, it is possible to increase maximum electric current by extending the emitter length. If, however, the emitter length is extended, then the distance from each of the operating portions of the transistor to each of the P+ base drawing diffusion regions 14A, 14B, 14C and 14D becomes long and hence the resistance therebetween increases. Therefore, excessive elongation of the distance leads to the situation that a desired voltage cannot be applied to the corresponding operating portion of the transistor.

As a method for ensuring a large circulating current, it is considered that, for example, the unit shown in FIG. 13 is arranged in plural form and the wirings 8, 9 and 10 are shared, thereby activating those units as a single transistor. According to the construction of the fifth embodiment (see FIG. 18), however, the individual units can efficiently be disposed by the overlap of the N+ collector diffusion regions as compared with the case in which such a method is used. Therefore, according to the construction of the present embodiment, a lateral bipolar transistor that allows large current to circulate can be realized in a smaller area.

Figure 19:
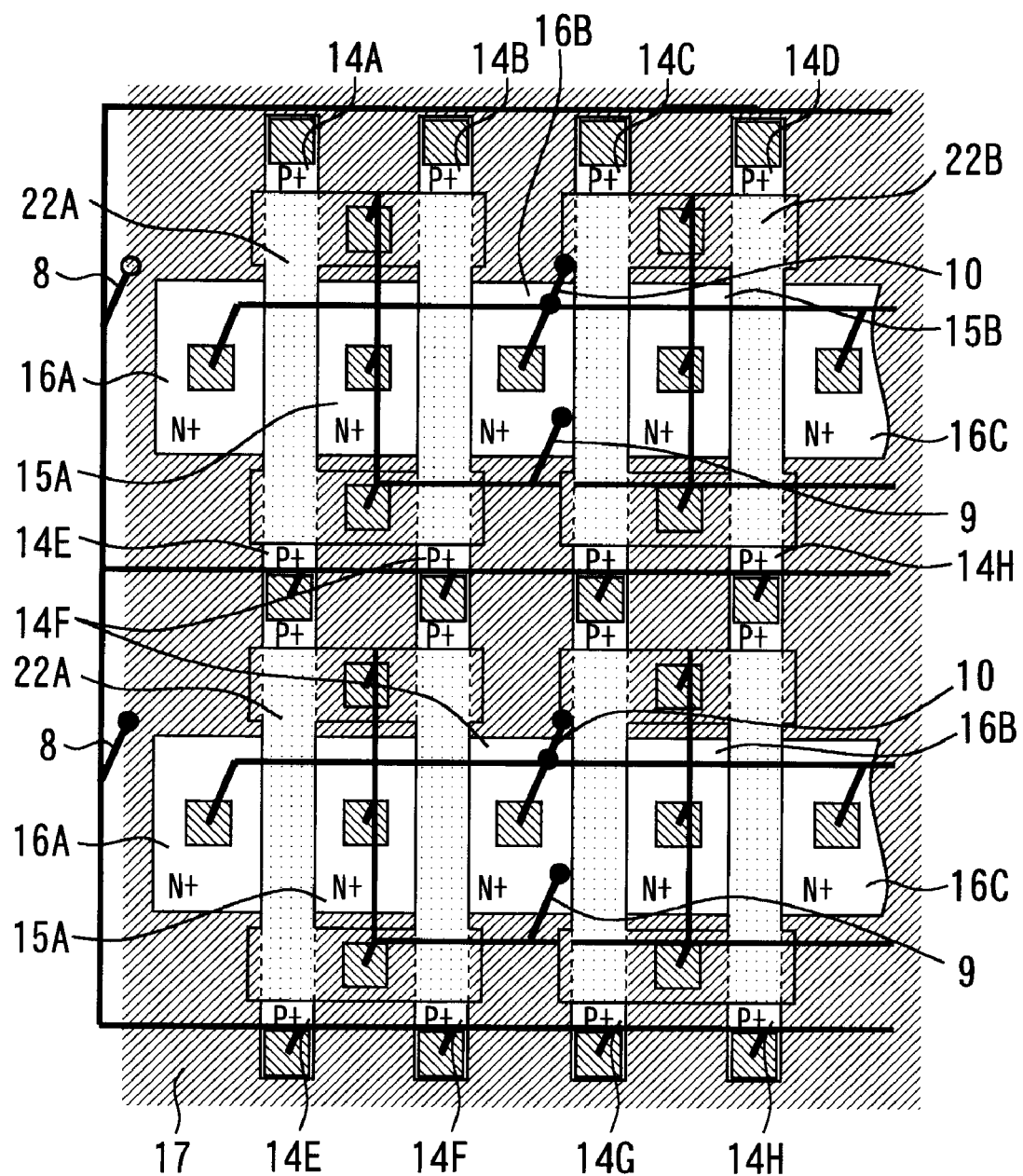
FIG. 19 is a plan view of a lateral bipolar transistor which is a modification of the fifth embodiment of the present invention.

Incidentally, although the fifth embodiment describes that the unit shown in FIG. 13 is arranged in parallel in plural form such that the N+ collector diffusion regions overlap one another, the method of arranging the units is not limited to it. That is, as shown in FIG. 19, the unit shown in FIG. 13 maybe vertically arranged in plural form such that the P+ base drawing diffusion regions overlap each other.

Sixth Embodiment

Construction of Sixth Embodiment

A sixth embodiment of the present invention will next be explained with reference to FIGS. 20 through 24. In these figures, a left area indicates a sectional structure of the lateral bipolar transistor according to the fourth embodiment, and a right area indicates a sectional structure of an N channel type MOS transistor. In these figures, ones associated with the constituent elements employed in any of the first through fifth embodiments are respectively given common reference numerals.

The first through fifth embodiments do not refer particularly to the conduction type of the conductive layer 22. In those embodiments, no particular reference is made even to the conduction type of the gate conductive layer 42 of the MOS transistor formed together with the lateral bipolar transistor. The lateral bipolar transistor of the present embodiment has the feature in that as shown in FIG. 20, a gate conductive layer 42 of a MOS transistor (N channel type) is of a high-concentration N type (N+) whereas each conductive layer 22 is prepared on an intrinsic basis.

Figure 20:
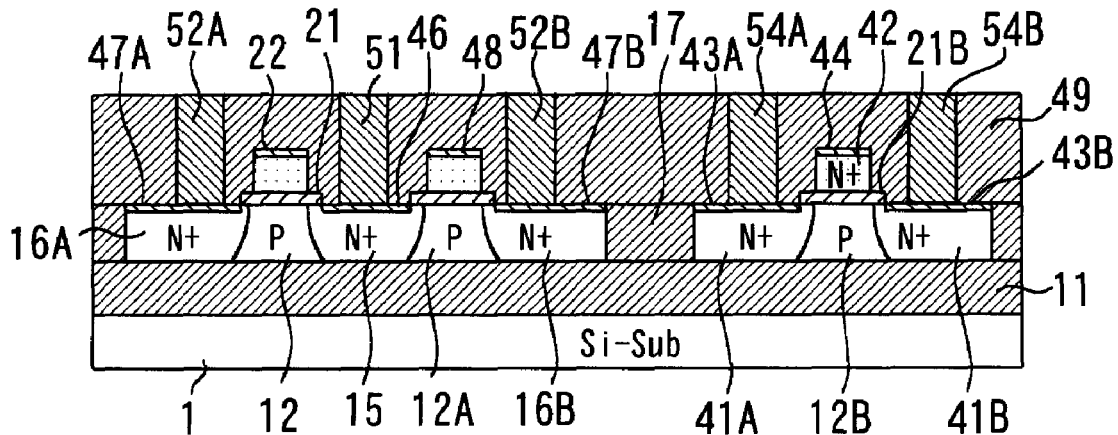
FIG. 20 is a diagram for describing the construction of a lateral bipolar transistor according to a sixth embodiment of the present invention.

FIG. 20 shows an example in which the conductive layer 22 is made intrinsic with the structure of the lateral bipolar transistor according to the fourth embodiment as the basis. However, any transistor to which the present invention can be applied, is not limited to it. That is, the basic structure of the transistor may be any of the structures of the first through fifth embodiments so long as the conductive layer 22 is prepared on an intrinsic basis.

Manufacturing Method of Sixth Embodiment

Figure 21:
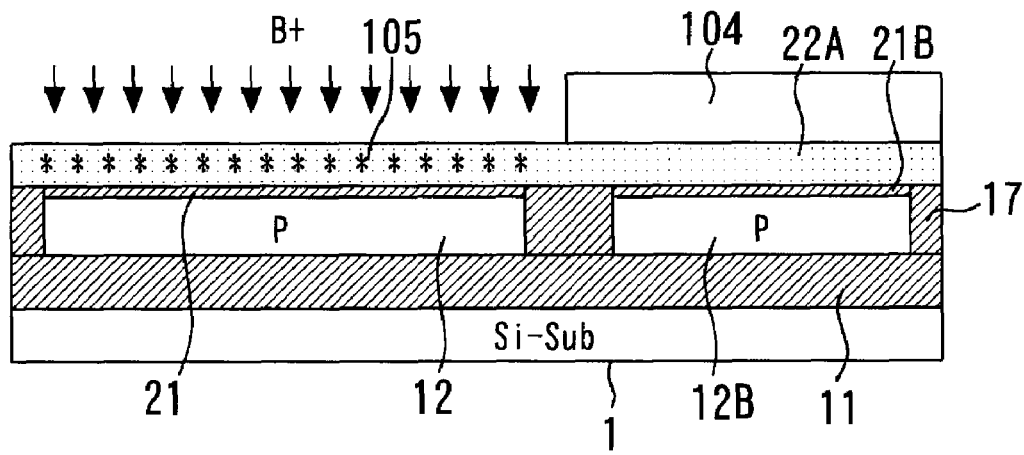
FIGS. 21 through 24 are diagrams for describing a fabricating method of the lateral bipolar transistor of the first embodiment of the present invention.

FIGS. 21 through 24 are respectively diagrams for describing a method of manufacturing the lateral bipolar transistor according to the sixth embodiment. In a process for manufacturing the transistor of the present embodiment, an embedded oxide film 11 and an SOI layer are first formed on a P type silicon substrate 1 as shown in FIG. 21. Next, an isolation insulating film 17 and P type SOI layers 12 and 12B are formed on the P type silicon substrate 1.

Next, an insulating film 21 for a bipolar transistor and a gate insulating film 21B for a MOS transistor are respectively formed on the P type SOI layers 12 and 12B. Further, polysilicon 22A used as a base material for conductive layers 22 and a gate conductive layer 42 are deposited on the insulating film 21 and the gate insulating film 21B. Thereafter, a P type impurity 105 such as boron B is ion-implanted in high concentration into the polysilicon 22A deposited in a forming area of the bipolar transistor with a photo-resist 104 used as a mask, the photo-resist 104 being formed so as to cover a forming area of an N channel type MOS transistor.

Although not shown in the figures, a P channel type MOS transistor is normally formed on the silicon substrate 1 along with the lateral bipolar transistor and the N channel type MOS transistor. In this case, there is a need to form a gate conductive layer prepared in a P type in a forming area of the P channel type MOS transistor. When the P channel type MOS transistor is formed on the silicon substrate 1, the implantation of a P type impurity into the gate conductive layer and the implantation of the P type impurity shown in FIG. 21 are carried out in the same process.

Figure 22:
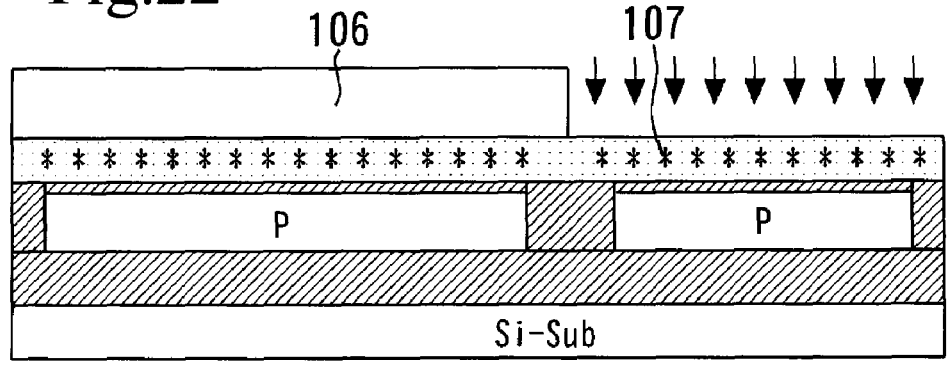

After the removal of the photo-resist 104, a photo-resist 106 is patterned so as to cover the forming area of the bipolar transistor as shown in FIG. 22. Next, an N type impurity 107 such as arsenic As is ion-implanted in high concentration into the corresponding forming area of the N channel type MOS transistor with the photo-resist 106 as a mask.

Figure 23:
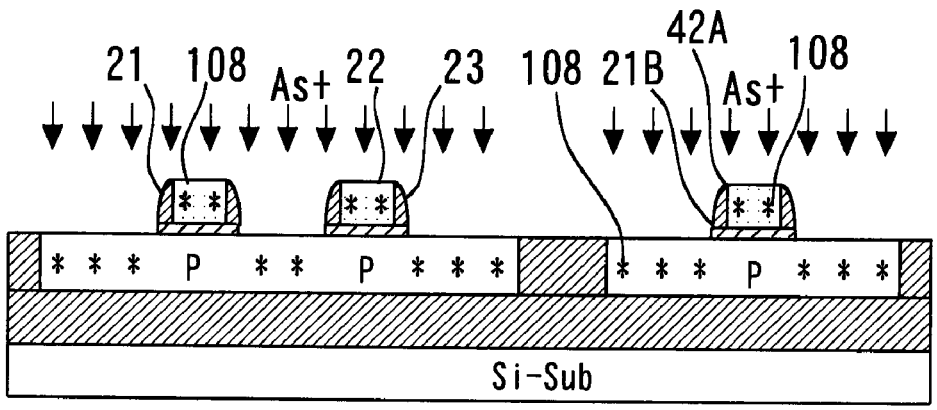

After the removal of the photo-resist 106, the polysilicon 22A is patterned into the shapes of conductive layers 22 and a gate conductive layer 42. Next, LDD implantation (not shown) corresponding to the standard MOS process and the formation of sidewalls 23 by an insulating film are carried out. Afterwards, an N type impurity such as arsenic As is implanted into both of the forming area for the bipolar transistor and the forming area for the N channel type MOS transistor as shown in FIG. 23.

With the above-described implantation of N type impurity, the polysilicon 22A used as the conductive layers 22 for the bipolar transistor is brought into a state in which the P type impurity (see FIG. 21) and the N type impurity (see FIG. 23) have been injected approximately uniformly. On the other hand, the polysilicon 42A used as the gate conductive layer 42 for the N channel type MOS transistor is brought into a state in which only the N type impurity has been injected in high concentration.

Figure 24:
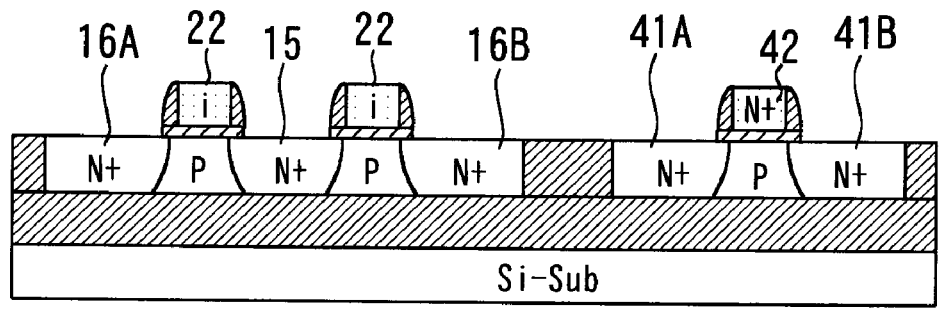

When the P channel type MOS transistor is formed on the silicon substrate 1, the process of ion-implanting a P type impurity into the gate conductive layer in concentration is performed. Thereafter, heat treatment for activating the implanted impurity is carried out. As a result, an N+ type gate conductive layer 42 is formed in the forming area of the N channel type MOS transistor as shown in FIG. 24. P and N types are counterbalanced to form intrinsic conductive layers 22 in the forming area of the bipolar transistor.

With the execution of the heat treatment, the SOI layer in the forming area of the bipolar transistor includes a portion covered with the corresponding conductive layer 22, which serves as a P type SOI layer 12, and portions uncovered with the conductive layers 22, which serve as an N+ type emitter diffusion region 15 and N+ type collector diffusion regions 16A and 16B. On the other hand, the SOI layer in the forming area of the N channel type MOS transistor includes a portion covered with the gate conductive layer 42, which serves as a P type body, and portions uncovered with the gate conductive layer 42, which serve as N+ source-drain layers 41A and 41B.

After the formation of the state shown in FIG. 24, silicide layers 43 through 48 are selectively formed on silicon and polysilicon. Next, an insulating film 49 is formed, contact holes are made open, and a metal such as tungsten is embedded into the contact holes, so that contact holes 50 through 54 are formed. Afterwards, metal wiring is further made, whereby such a lateral bipolar transistor as shown in FIG. 20 is formed.

Effects by Sixth Embodiment

In the lateral bipolar transistor according to the sixth embodiment, the conductive layers 22 formed on the P type SOI layer (base diffusion region) 12 are prepared in intrinsic form. A work function of intrinsic polysilicon becomes higher than that of N type polysilicon. Therefore, when the conductive layer 22 is intrinsic, a bend of a band at the boundary between the insulating film 21 and the P type SOI layer 12 is relaxed as compared with the case in which each conductive layer 22 is of an N type.

In the bipolar transistor, a small current (leak current) is difficult to flow through its portion as the bend of the band at its portion is relaxed. Further, as the leak current at the boundary between the P type SOI layer 12 and the insulating film 21 decreases, the injection efficiency of its emitter is improved. Therefore, according to the lateral bipolar transistor of the present embodiment, excellent gain can be realized.

Incidentally, although the NPN type bipolar transistor is formed on the silicon substrate 1 in the sixth embodiment, the present invention is not limited to or by it. That is, the present invention may be applied to the case in which a PNP type bipolar transistor is formed. The process of implanting the N type impurity into the gate conductive layer for the N channel MOS transistor and the process of implanting the P type impurity into the gate conductive layer for the P channel type MOS transistor are generally performed in the manufacturing process of the MOS transistor. Therefore, the conductive layer for the NPN type bipolar transistor and the conductive layer for the PNP type bipolar transistor can be brought into intrinsic form by simply changing the mask pattern in the forming area of the bipolar transistor without adding a new process to the MOS process. Thus, even though the bipolar transistor is of either the NPN type or the PNP type, the construction of the sixth embodiment can be realized without involving a large rise in cost.

Although the sixth embodiment has been described assuming that the lateral bipolar transistor is formed on the SOI substrate, the present invention is not limited to it. That is, the invention that suppresses the leak current by the above-descried method may be applied upon forming a bipolar transistor on a bulk substrate.

Seventh Embodiment

Figure 25:
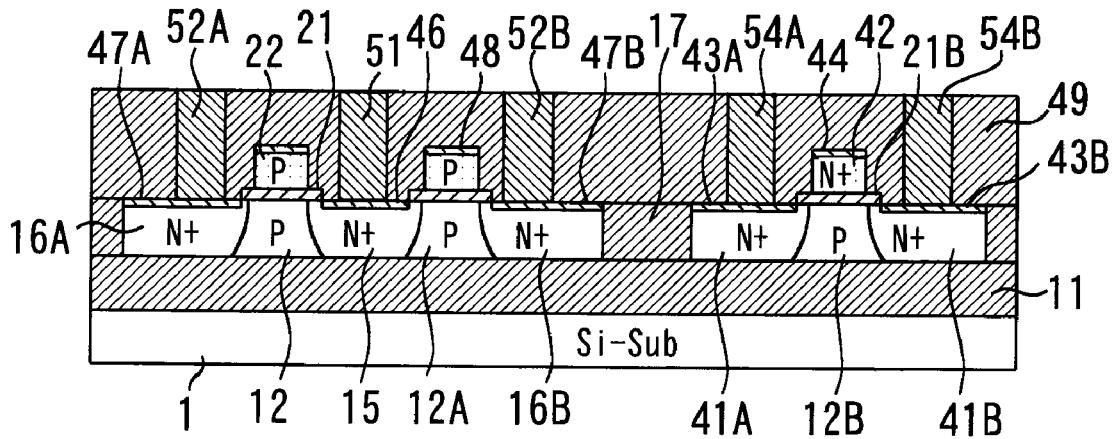
FIG. 25 is a diagram for describing the construction of a lateral bipolar transistor according to a seventh embodiment of the present invention.
Figure 26:
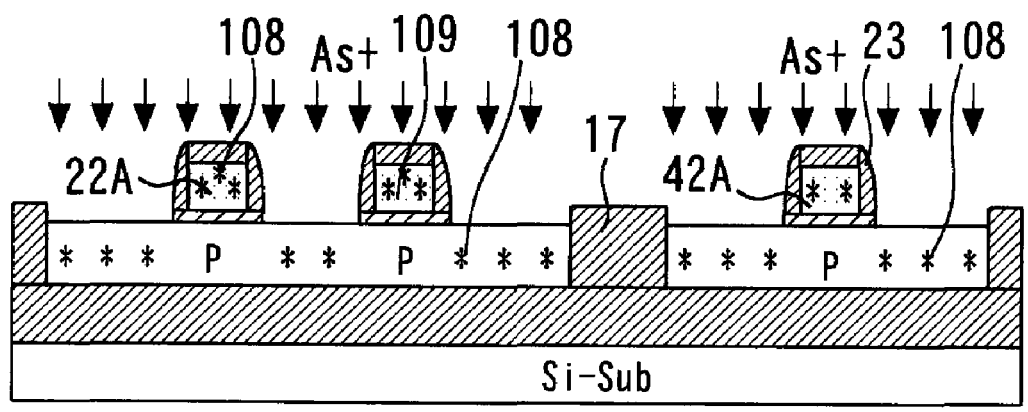
FIGS. 26 and 27 are diagrams for describing a fabricating method of the lateral bipolar transistor of the seventh embodiment of the present invention.
Figure 27:
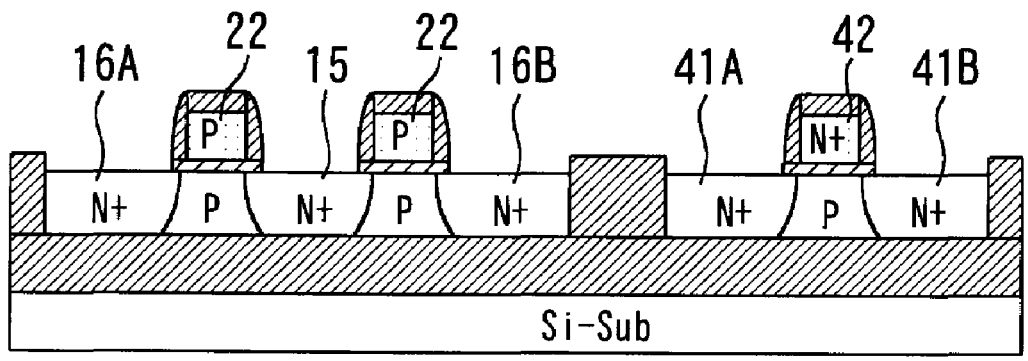

A seventh embodiment of the present invention will next be explained with reference to FIGS. 25 through 27. In FIGS. 25 through 27 in a manner similar to the sixth embodiment referred to above, a left area indicates a sectional structure of the lateral bipolar transistor according to the fourth embodiment, and a right area indicates a sectional structure of an N channel type MOS transistor. In these figures, ones associated with the constituent elements employed in any of the first through fifth embodiments are respectively given common reference numerals.

In the lateral bipolar transistor of the present embodiment, as shown in FIG. 25, a gate conductive layer 42 of a MOS transistor (N channel type) is of a high-concentration N type (N+ ) whereas each conductive layer 22 is prepared as a P type. Except for this point, the lateral bipolar transistor of the present embodiment is similar to the transistor of the sixth embodiment.

FIG. 25 shows an example in which the conductive layers 22 are respectively formed as a P type with the structure of the lateral bipolar transistor according to the fourth embodiment as the basis. However, any transistor to which the present invention can be applied, is not limited to it. That is, the basic structure of the transistor may be any of the structures of the first through fifth embodiments so long as each conductive layer 22 is prepared as the P type.

Manufacturing Method of Seventh Embodiment

A method of manufacturing the lateral bipolar transistor of the seventh embodiment will be explained below with reference to FIGS. 21 and 22 together with FIGS. 26 and 27. In the process of manufacturing the transistor of the present embodiment, an isolation insulating film 17 is formed on a silicon substrate 1 by a procedure similar to that of the sixth embodiment (see FIG. 21). Here, however, the isolation insulting film 17 is formed thicker by the thickness of an on-electrode oxide film 109 formed on each of conductive layers 22 and a gate conductive layer 42 in a pro-process (see FIG. 26) as compared with the sixth embodiment.

Next, a P type impurity 105 is implanted into a forming area of a bipolar transistor in accordance with the procedure similar to that of the sixth embodiment (see FIG. 21). Further, an N type impurity 107 is implanted into a forming area of an N channel type MOS transistor (see FIG. 22). Next, an oxide film is deposited over the entire surface of a substrate, and polysilicon 22A and 42A are patterned in such a manner that the oxide film remains on the polysilicon 22A and 42A.

Walls 23 are formed again so as to cover the side faces of the patterned polysilicon 22A and 42A. Thereafter, as shown in FIG. 26, an N type impurity 108 such as arsenic As is ion-implanted in high concentration into the entire surface of the silicon substrate 1. In this case, the N type impurity 108 is implanted in high concentration into an SOI region uncovered with the polysilicon 22A and 42A. On the other hand, since the on-electrode oxide film 109 serves as a barrier, only part of the N type impurity is implanted in low concentration into the polysilicon 22A and 42A used as the conductive layers 22 and the gate conductive layer 42.

A P type impurity is injected in high concentration into the polysilicon 22A used as each conductive layer 22 in accordance with the process shown in FIG. 21. Therefore, after the implanting process shown in FIG. 26, the polysilicon 22A is placed in a state in which the P type impurity has been implanted in high concentration as compared with the N type impurity.

When heat treatment for activating the impurity is performed, an N type gate conductive layer 42 is formed in an N channel type MOS region in a manner similar to the sixth embodiment as shown in FIG. 27. On the other hand, P type conductive layers 22 are formed in the forming area of the bipolar transistor. Processing similar to the sixth embodiment is subsequently performed, whereby such a lateral bipolar transistor as shown in FIG. 25 is formed.

Effects by Seventh Embodiment

In the lateral bipolar transistor according to the seventh embodiment, the conductive layers 22 formed on the P type SOI layer (base diffusion region) 12 are configured as the P type. Therefore, the work function of the conductive layer 22 is approximately identical to that of the P type SOI layer 12 in the construction of the present embodiment. That is, the bend of the band is almost nonexistent in the boundary between the insulating film 21 and the P type SOI layer 12 in the construction of the present embodiment.

If the bend of the band does not exist in part of the bipolar transistor, it is then possible to further suppress the circulating flow of a small current (leak current) at the P type SOI layer 12 as compared with the sixth embodiment. Therefore, according to the lateral bipolar transistor of the present embodiment, more excellent gain can be realized as compared with the sixth embodiment.

The manufacturing process of the seventh embodiment includes a process for etching the polysilicon 22A and 42A by the on-electrode oxide film 109 functioning as a mask. Such a process is generally performed in the manufacturing process of the MOS transistor. Accordingly, the lateral bipolar transistor of the present embodiment can be manufactured by use of the general MOS process without adding a novel process in particular.

Although the seventh embodiment has been described assuming that the lateral bipolar transistor is formed on the SOI substrate, the present invention is not limited to it. That is, the invention that suppresses the leak current by the above-descried method may be applied upon forming a bipolar transistor on a bulk substrate.

Further, in the sixth and seventh embodiments, the conduction type of each conductive layer 22 is set as intrinsic or the P type to suppress the leak current at the P type SOI layer 12. However, the method of suppressing the leak current is not limited to it. That is, the leak current of the P type SOI layer 12 can be suppressed if the conduction type of the conductive layer 22 is close to the P type as compared with the gate conductive layer for the N channel type MOS transistor. Thus, the conductive layer 22 may be an N type low in concentration as compared with the gate conductive layer 42 without being limited to the intrinsic form and the P type.

The major benefits of the present invention described above are summarized as follows:

According to a first aspect of the present invention, central areas of a base diffusion region are provided so as to surround emitter diffusion regions. Further, a collector diffusion region is provided so as to surround the central areas. Therefore, sufficient contact areas can be obtained between the emitter diffusion regions and the base diffusion region as well as between the collector diffusion region and the base diffusion region respectively. According to the present invention, isolation insulating films are disposed between a base drawing diffusion region and the emitter diffusion regions. When the base drawing diffusion region and the emitter diffusion regions are adjacent to each other without via the isolation insulating films, a situation occurs that some of carriers which is expected to flow from the emitter diffusion regions to the base diffusion region flow directly from the emitter diffusion regions to the base drawing diffusion region. As a result, the injection efficiency of the emitter of the bipolar transistor is degraded. According to the present invention, the inflow of such carriers can be blocked by the isolation insulating films. Therefore, according to the present invention, a lateral bipolar transistor, which can be formed by use of a MOS process and is capable of ensuring a sufficient collector current, can be materialized.

According to a second aspect of the present invention, base diffusion regions and collector diffusion regions are provided on both sides of an emitter diffusion region. Therefore, the area at which the emitter diffusion region and each of the base diffusion regions are brought into contact, and the area at which each of the collector diffusion regions and each of the base diffusion regions are brought into contact can both be ensured sufficiently. According to the present invention, base drawing diffusion regions are formed at their corresponding positions spaced away from the emitter diffusion region, and an isolation insulating film is formed which blocks the flow of carriers traveling from the emitter diffusion region to the base drawing diffusion regions. Therefore, even the present invention can realize a lateral bipolar transistor which can be formed by use of a MOS process and is capable of securing a sufficient collector current.

Further, the present invention is not limited to these embodiments, but variations and modifications may be made without departing from the scope of the present invention.

The invention claimed is:

1. A lateral bipolar transistor formed over a substrate of an SOI structure having a silicon layer provided over an embedded insulating film layer, comprising:
    emitter diffusion regions formed in the substrate;
    a base drawing diffusion region formed at a position away from each of the emitter diffusion regions;

isolation insulating films that reach the embedded insulating film layer and are formed between the emitter diffusion regions and the base drawing diffusion region;

a base diffusion region including, on both sides of the isolation insulating films, two end areas respectively brought into contact with the side faces of the isolation insulating films while ensuring electrical connections to the base drawing diffusion region, and central areas formed integrally with the two end areas so as to cover the peripheries of the emitter diffusion regions; and a collector diffusion region at least formed around the central areas of the base diffusion region.

2. The lateral bipolar transistor according to claim 1, wherein the emitter diffusion regions and the isolation insulting films are respectively provided on both sides of the base drawing diffusion region, wherein the base diffusion region is formed in a ring form so as to surround the peripheries of the base drawing diffusion region, the two isolation insulating films disposed on both sides of the base drawing diffusion region and the two emitter diffusion regions disposed outside the isolation insulating films, and wherein the collector diffusion region is formed in ring form so as to cover the periphery of the base diffusion region.

3. The lateral bipolar transistor according to claim 2, further including a base wiring provided with respect to the base drawing diffusion region;

an emitter wiring provided in common with all of the emitter diffusion regions; and a collector wiring provided with respect to the collector diffusion region.

4. The lateral bipolar transistor according to claim 1, wherein the central areas of the base diffusion regions respectively have three sides connected to one another so as to surround the emitter diffusion regions, and wherein connecting portions of the three sides are respectively brought into corner-cut shapes.

5. The lateral bipolar transistor according to claim 1, wherein each of the base diffusion regions is prepared in the form of a first conduction type, wherein a MOS transistor which includes a gate insulating film and a gate conductive layer prepared in the form of a second conduction type different from the first conduction type and is constructed so as to form a channel of the second conduction type, is formed over the substrate, and wherein the lateral bipolar transistor further includes an insulating film which covers the surfaces of the base diffusion regions, and conductive layers formed over the insulating film in a state in which the characteristic of the second conduction type is suppressed as compared with the gate conductive layer.

6. The lateral bipolar transistor according to claim 5, wherein the gate conductive layers over the base diffusion regions are intrinsic from the viewpoint of a conduction type.

7. The lateral bipolar transistor according to claim 5, wherein the conductive layers over the base diffusion regions are prepared in the first conduction type the same as the base diffusion regions.

* * * * *